United States Patent [19]

Sato et al.

[11] Patent Number: 4,789,294

[45] Date of Patent: Dec. 6, 1988

[54] WAFER HANDLING APPARATUS AND METHOD

[75] Inventors: Mitsuya Sato, Yokohama; Shunzo Imai, Yamato; Ryozo Hiraga, Kanaga, all of Japan

[73] Assignee: Canon Kabushiki Kaisha, Tokyo, Japan

[21] Appl. No.: 900,711

[22] Filed: Aug. 27, 1986

[30] Foreign Application Priority Data

| Aug. 30, 1985 | [JP] | Japan | 60-189869 |
| Aug. 30, 1985 | [JP] | Japan | 60-189870 |
| Aug. 30, 1985 | [JP] | Japan | 60-189871 |
| May 9, 1986 | [JP] | Japan | 61-104843 |

[51] Int. Cl.⁴ .............................................. B65H 5/08
[52] U.S. Cl. .................................. 414/416; 414/222; 414/225; 414/749; 414/744.6
[58] Field of Search .............. 414/222, 225, 416, 217, 414/226, 744 R, 744 B, 749, 752

[56] References Cited

U.S. PATENT DOCUMENTS

| 3,823,836 | 7/1974 | Cheney et al. | 414/225 |
| 3,874,525 | 4/1975 | Hassan et al. | 414/225 |
| 3,921,788 | 11/1975 | Roberson Jr. et al. | 414/222 |
| 4,501,527 | 2/1985 | Jacoby et al. | 414/744 B |
| 4,553,069 | 11/1985 | Purser | 414/225 X |
| 4,568,234 | 2/1986 | Lee et al. | 414/416 X |
| 4,582,191 | 4/1986 | Weigand | 414/744 B X |

Primary Examiner—Kenneth J. Dorner
Assistant Examiner—Peter R. Brown
Attorney, Agent, or Firm—Morgan & Finnegan

[57] ABSTRACT

A wafer processing apparatus, comprising a wafer processing station for processing a wafer, a key input portion for inputting wafer processing instructions into the wafer processing station, and wherein at least one of a portion for accommodating a wafer carrier for carrying the wafer, a mechanism for taking the wafer out of the wafer carrier and putting it back into the wafer carrier, wafer alignment station for aligning the wafer and a wafer observing station for allowing an operator to observe the wafer, is disposed at a front side of the apparatus to which the operator faces when actuating the key input portion.

9 Claims, 14 Drawing Sheets

FIG. I

WAFER HANDLING APPARATUS AND METHOD

FIELD OF THE INVENTION AND RELATED ART

The present invention relates to a wafer handling apparatus and a wafer handling method, for example, a wafer prober for probing semiconductor chips in the field of the semiconductor circuit manufacture.

The wafer prober is an apparatus by which a number of IC (integrated circuit) chips formed on a semiconductor wafer are probed or inspected with respect to their properties prior to the wafer is cut into the respective IC chips. The inspection is actually performed by an IC tester. The wafer prober functions to establish accurate electric contact between the IC tester and the respective IC chips on the wafer.

FIG. 11 shows a conventional arrangement of a wafer prober, which comprises a transportation unit 40, a main assembly of the wafer prober 41, a supply wafer carrier 42 and a receiving wafer carrier. A wafer to be fed into the main assembly 41 for inspection is designated by a reference 44, and a wafer which has been inspected and is to be received by the wafer carrier 42 is designated by a reference 45. As will be understood, the supply carrier 42 and the receiving carrier 43 are separate. This has become disadvantageous because a number of wafer carriers are used due to the recent increase of the wafer size of the recent trend to an automatic system. More particularly, using separate wafer carriers for supplying and collecting the wafers results in the increase of the size of the transportation system.

FIG. 12 shows an arrangement which has been proposed in order to solve the above-described problem. This system comprises wafer carriers 46, 47 and 48 each usable for both supplying and receiving the wafers and a wafer hand 50 for taking the wafers into and out of the wafer carriers, wherein the wafer is depicted by a reference 49. The same reference numerals as in FIG. 11 are assigned to the corresponding elements by this arrangement, a single wafer carrier is usable for supplying and collecting the wafers. However, space is required for taking the wafers out of the plural wafer carriers 46, 47 and 48, and therefore, the apparatus is bulky.

FIG. 13 illustrates an arrangement which has been proposed in U.S. Ser. No. 763,213 assigned to the assignee of the present application, whereby the disadvantages described with FIGS. 11 and 12 have been eliminated. The apparatus comprises wafer carriers 51 and 52 each for supplying and receiving the wafers and a wafer hand 54 for taking the wafers into out of the wafer carrier and an operation panel 55. A reference numeral 53 designate a wafer. The wafer hand 54 is rotatable as indicated by an arrow in this Figure. As will be understood, the space required for taking the wafer out of the wafer carriers 51 and 52 is common for the wafer carriers 51 and 52, thus reducing the required space.

FIG. 14 illustrates the situation around the wafer prober when the transportation system of FIG. 13 is used with the wafer prober. The reference numerals 56, 57 and 58 designate an operator, an operation area and a passage, respectively. The other reference numerals depict the same element as in FIG. 13.

It is true that the size of the apparatus is reduced by the arrangement shown in FIG. 14, as compared with the arrangements shown in FIGS. 11 and 12. However, it has been found that their still exists a disadvantage that the wafer carriers are remote from the operation area 55, and therefore, the operativity is not very good. This is the same as in the arrangements shown in FIGS. 11 and 12. This problem is not very serious when the used wafer has the diameter of 6 inch or less, but as for the wafers having the diameter of 8 inch or more, this problem is serious due to the bulkiness and the weight of the wafer carrier. More particularly, the wafer carrier 51 located at the rear side, this is, remote from the front side of the wafer prober, becomes difficult to handle, and therefore, it becomes necessary to handle this wafer carrier from the lateral side thereof. Because of this, the wafer prober having the transportation system like this, requires a passage 58 beside the wafer prober for the purpose of setting and removing the wafer carriers, as shown in FIG. 14.

As shown in FIG. 15, therefore, it is difficult to arrange the wafer probers in a factory, and the arrangement is limited to that shown in FIG. 16. When the arrangements of FIGS. 15 and 16 are compared, it will be understood that the arrangement of FIG. 15 is better from the standpoint of utilizing the space. However, the operativity of the arrangement of FIG. 15 is still bad since the transportation unit 40 is remote from the operator 56.

It is a known improvement of the FIG. 12 arrangement that the supplying and receiving wafer carriers 46, 47 and 48 are supported on a single plate, and the plate is drawn to the front side while supporting all the wafer carriers 46, 47 and 48, when the wafer carrier is to be interchanged. This, however, is still disadvantageous in that when the rear side wafer carrier 46 is to be exchanged, the operation with the front side wafer carriers 47 and 48 must be interrupted.

In order to assure the safety of taking the wafers out of and back into the wafer carriers 46, 47 and 48, it is preferable that the correct positions of the wafers are determined in the wafer carriers. In the system wherein all the wafer carriers are drawn out together, when only one wafer carrier is exchanged, the wafers in the rest of the wafer carriers are moved, and therefore, the measurement and determination of the correct positions of the wafers become nonsense.

Additionally, in the conventional wafer probers, a pre-alignment station and an observation station require relatively large space, which is a main cause of the bulkiness of the wafer prober. The prealignment station is a station which receives a wafer from a wafer carrier and brings it into relatively rough alignment prior to carrying the wafer onto the wafer chuck. The observation station is a station which stops a wafer tentatively to permit the operator to observe the surface of the wafer with naked eyes after the wafer has been probed and collected from the wafer chuck.

SUMMARY OF THE INVENTION

Accordingly, it is a principal object of the present invention to provide a wafer handling apparatus and a wafer handling method by which the size of the system is reduced.

It is another object of the present invention to provide a wafer handling apparatus and a wafer handling method by which a large size wafer carrier can be set from the front side of the apparatus.

It is a further object of the present invention to provide a wafer handling apparatus and a wafer handling method in which transportation unit need not be interchanged or adjusted even when the size of the wafer is changed.

It is a further object of the present invention to provide a wafer handling apparatus and a wafer handling method by which the wafer can be handled and processed on a line automatically with ease.

According to an embodiment of the present invention, at least one of the wafer carrier, a wafer supplying and/or receiving mechanism, a wafer prealignment station and a wafer observing station is disposed at a front side of the apparatus adjacent a key-input operation panel, whereby the size of the apparatus is reduced very much. A particular transporting hand is used to make it possible to pre-align the wafer irrespective of the wafer size. The wafer handling apparatus according to the embodiment of the present invention is suitable for use with a wafer carrying car controlled by an optical communication system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
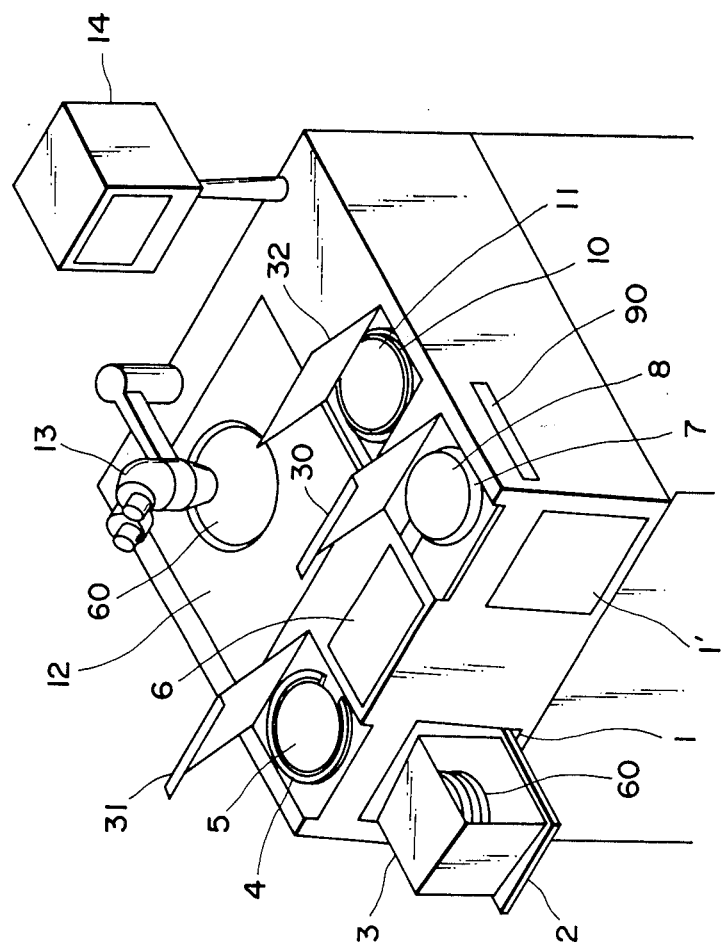
FIG. 1 is a perspective view of a wafer prober according to an embodiment of the present invention.

Referring now to FIG. 1, there is shown a wafer prober as an example of the wafer handling apparatus according to an embodiment of the present invention. The wafer prober is provided with a wafer carrier ports 1 and 1' through which the wafer carrier 3 is inserted or taken out on a wafer carrier table 2 which is slidable for exchange of the wafer carrier. A wafer observing station 4 permits the operator to observe the wafer which has been inspected by the probing station. The apparatus further comprises an operation panel 6 with input keys, a pre-alignment station 7 for roughly aligning the wafer, a wafer holding chuck for vacuum holding the wafer 10. The reference numerals 5, 8 and 11 designate a wafer which is being observed at the observation station, a wafer which is being pre-aligned and a wafer which is waiting for the probing operation, respectively. A head plate 12 supports a probe card (not shown) therein. The apparatus is equipped with a microscope 13 to be used when the probe card is set in place and a monitoring TV for displaying parameters with respect to the wafer probing operation and for setting a reference image (which will be hereinafter called "template", for the purpose of an automatic wafer alignment. Designated by a reference 90 is a wafer inlet for a line arrangement which will be described hereinafter.

Figure 2:
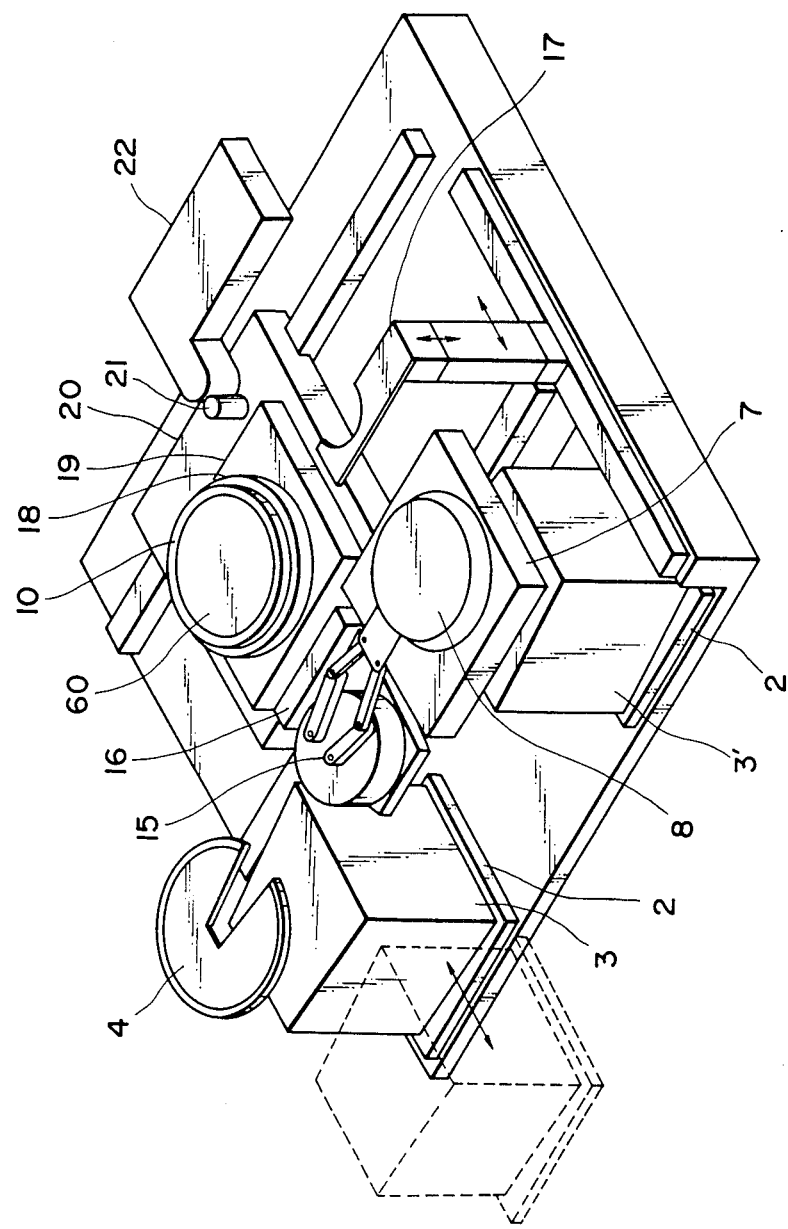
FIG. 2 is a perspective view of the internal of the wafer prober of FIG. 1.

FIG. 2 shows the internal mechanism of the wafer prober of FIG. 1. A pantagraph hand 15 functions to take the wafer out of any stage of the wafer carrier 3 and to put it back to the stage. The pantagraph hand as a whole is substantially vertically movable by a mechanism 16. A transportation hand 17 transports the wafer from the pre-alignment station 7 to the wafer chuck 10. A $\theta Z$ stage 18 rotates and/or substantially vertically moves the wafer chuck 10. The reference numerals 19 and 20 are X-stage and Y-stage, respectively of a known type. An electrostatic capacity type sensor 21 is effective to determine the outer periphery of the wafer and the height of the wafer surface. An auto-alignment microscope 22 is used to observe the pattern on the wafer surface for the purpose of an automatic alignment of the wafer.

Figure 3:
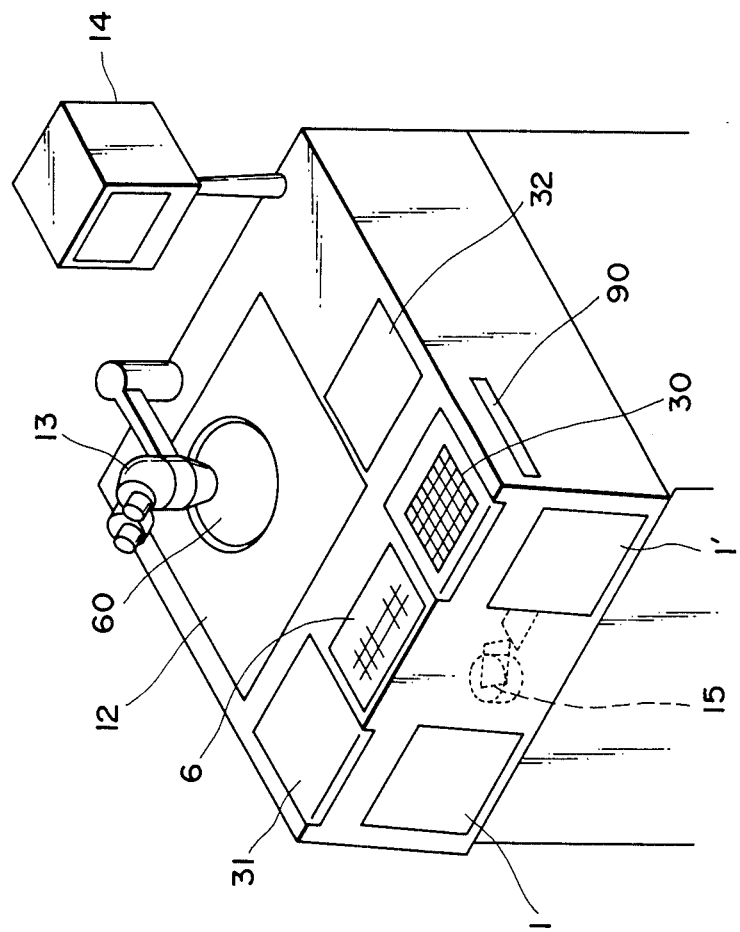
FIG. 3 is a perspective view showing the external appearance of the wafer prober of FIG. 1.

FIG. 3 shows the external appearance of the wafer prober of FIG. 1, wherein a flat keyboard 30 for setting various parameters and also functions as a cover. Transparent covers 31, 32 are provided on the top surface, which may function as keyboards. The characters or numerals on the keyboard is readable by an operator in the usual manner by the operator standing opposed to the wafer ports 1 and 1'.

Figure 4:
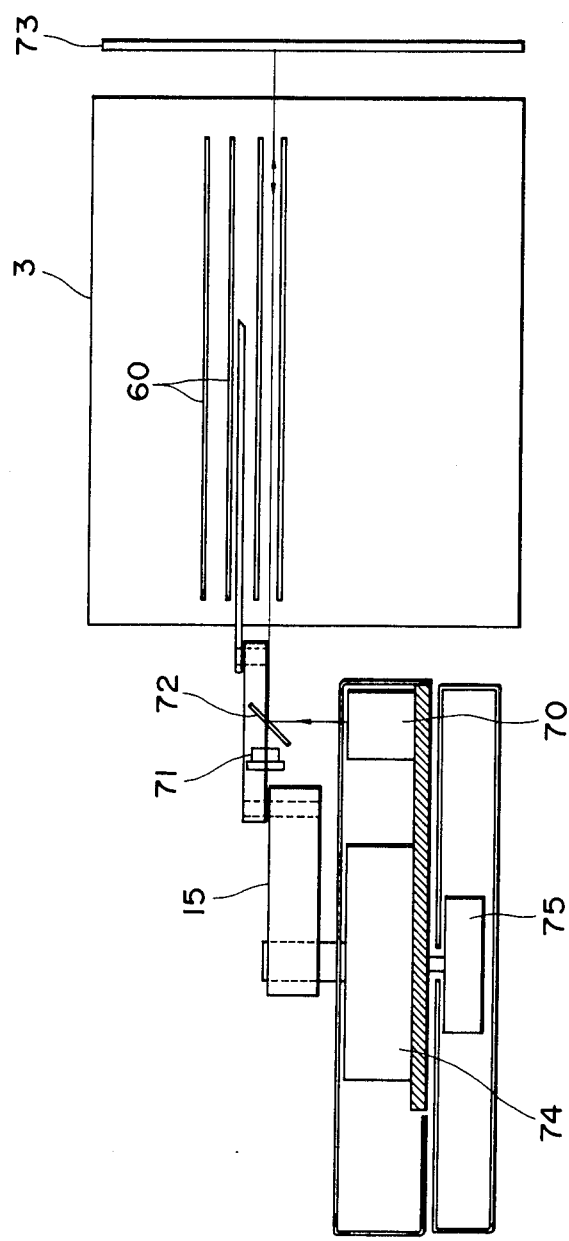
FIG. 4 is a side elevation of a pantagraph hand used with the embodiment of FIG. 1.

FIG. 4 is a sectional view of the pantagraph hand 15 shown in FIG. 2, wherein the wafer carrier is indicated by the reference numeral 3. A semiconductor laser 70 with a collimator is used as a light source for detecting the positions of the wafer in the wafer carrier 3 and also is effective as a light source for detecting presence or absence of the wafer at the stages therein. A photodetector 71 senses the laser beam reflected by a flat mirror 73 disposed behind the wafer carrier 3 as shown in FIG. 4. A half mirror 72 is disposed in front of the photodetector 71 to allow the laser beam produced by the semiconductor laser 70 to be reflected and to allow the laser beam reflected by the flat mirror 73 to transmit therethrough to the photodetector 71. A driver 74 functions to expand and collapse the pantagraph hand 15. A rotational driver 75 rotates the pantagraph hand 15 as a whole.

Figure 5:
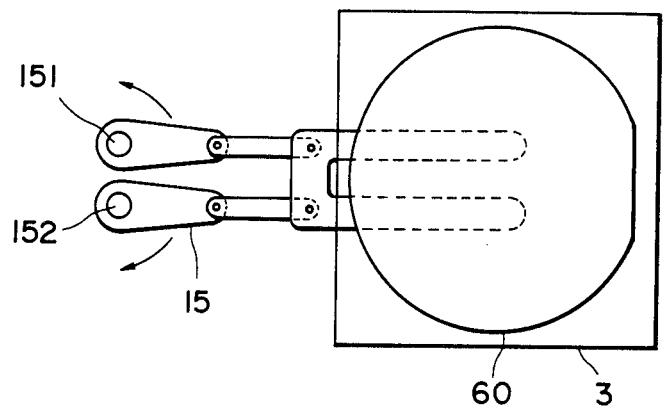
FIGS. 5 and 6 are plan view of the pantagraph hand of FIG. 4.
Figure 6:
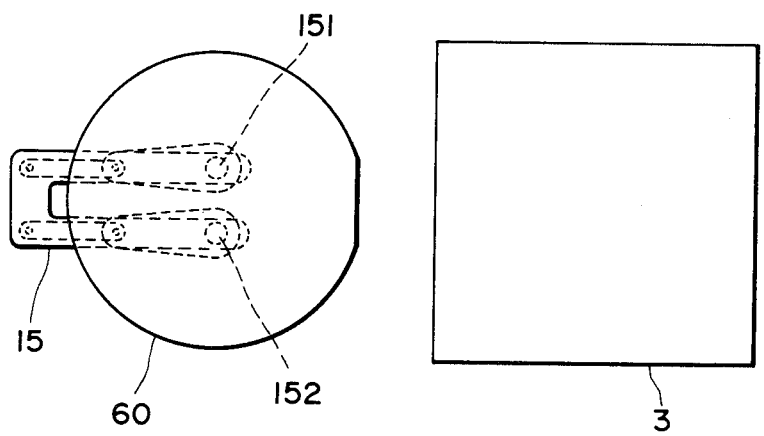

FIGS. 5 and 6 are top plan view of the pantagraph hand 15, and FIG. 5 illustrates the situation when the pantagraph hand 15 takes its expanded position by the operation of the driver 74, and FIG. 6 shows the collapsed state. The detailed explanation is omitted by assigning the same reference numerals as in FIG. 4 to the corresponding elements, since then those Figures are self-explanatory.

Figure 7:
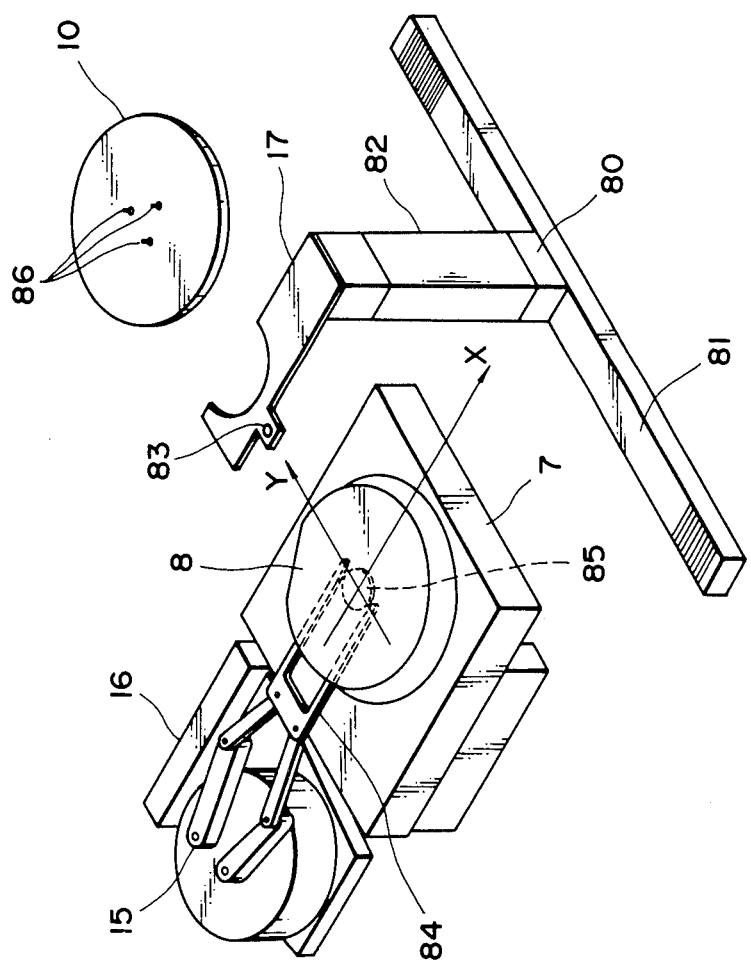
FIG. 7 is a perspective view of a pre-alignment station of the apparatus of FIG. 1.

FIG. 7 illustrates the structures around the pre-alignment station. As shown in this Figure, there is provided a linear pulse motor 80 for moving the transportation hand 17 in the direction of Y-axis. A scale 81 functions as a stator of the linear pulse motor 80. The transportation hand 17 is moved substantially vertically by a driving mechanism 82. The transportation hand 17 has a wafer sensor 83 fixed thereto, which serves to sense the outer periphery of the wafer from the backside of the wafer upon pre-alignment operation. The pantagraph hand has a finger 84. A wafer rotating mechanism 85 is effective to rotate the wafer thereon upon the pre-alignment operation. The wafer chuck 10 is provided with wafer chuck pins 86 for raising the wafer from the wafer chuck 10.

Figure 8:
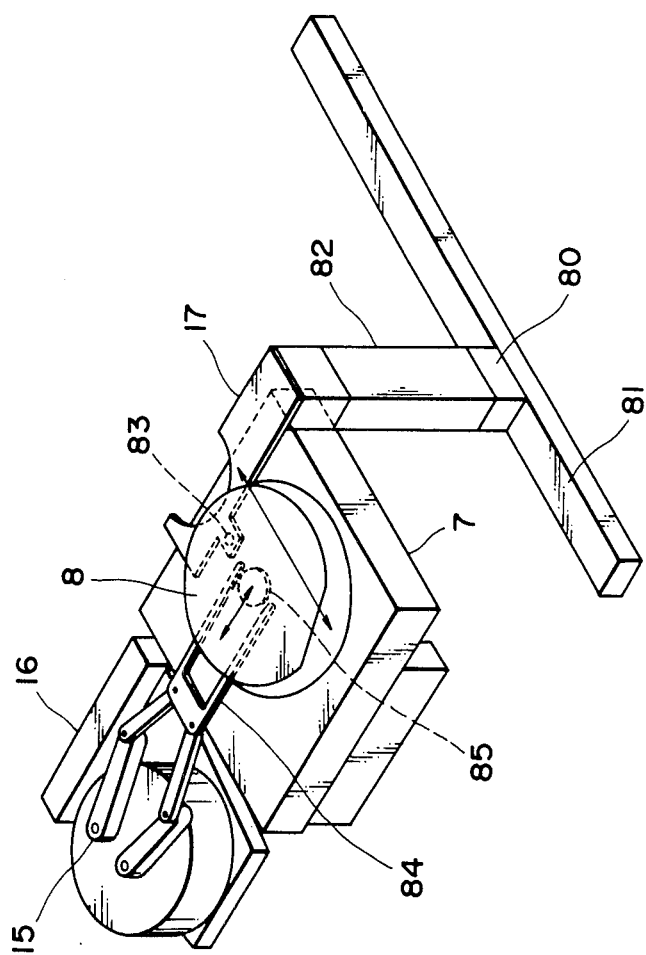
FIGS. 8 and 9 are perspective views illustrating operation of the pre-alignment station of FIG. 7.
Figure 9:
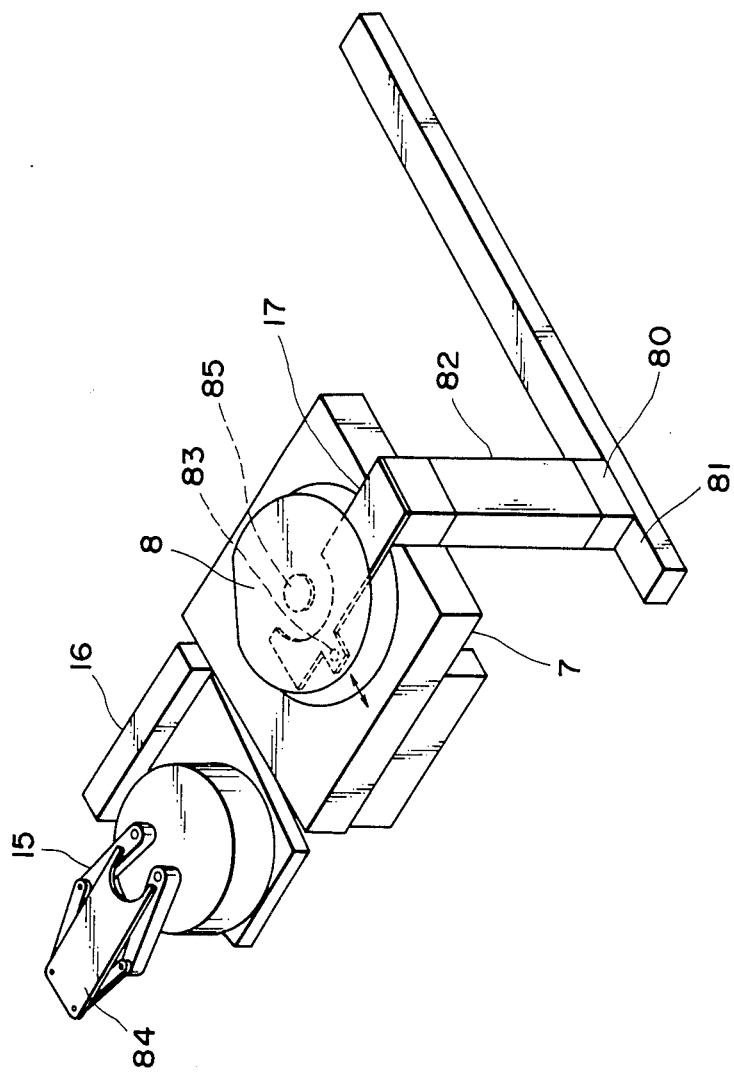

FIGS. 8 and 9 illustrate a part of pre-alignment operation, wherein FIG. 8 shows the state wherein the wafer sensor 83 senses the outer periphery of the wafer on the pantagraph hand 15, and FIG. 9 shows execution of the pre-alignment operation in the pre-alignment station.

The operation of the apparatus will be described. First, the description will be made as to the setting of the wafer carrier 3.

Referring back to FIG. 1, the operator actuates a carrier setting switch (not shown) on the operation panel 6 in order to set the wafer carrier 3 into the apparatus. Then, the wafer carrier table 2 goes out of the front side of the apparatus through the wafer carrier port 1, the front side of the apparatus being such a side of the apparatus as the operator faces in usual operation. The movement of the wafer carrier table is effected in this embodiment by a linear pulse motor. In FIG. 1, the lefthand wafer carrier table 2 is out, but it is understood that the righthand wafer carrier table 2 is movable in the same manner. The wafer carrier 3 is placed on the wafer carrier table 2, and thereafter, the operator actuates the carrier setting switch again, by which the wafer carrier table 2 moves back into the apparatus. At this time, the apparatus is waiting for the starting instructions.

Next, the description will be made with respect to the probing operation. When the apparatus is in the state of waiting for the starting instructions, the operator depressed the starting switch on the operation panel 6. Then, the pantagraph hand is rotated to face a designated wafer carrier while keeping its collapsed state (FIG. 6), and moves downwardly by the driving mechanism 16. As shown in FIG. 4, the pantagraph hand 15 is equipped therein with the semiconductor laser 70 and the photodetector 71 for sensing the wafer, by which the presence, the absence or the correct position of the wafer can be detected. Therefore, the pantagraph hand 15 is able to safely take the wafer 60 out of any position in the wafer carrier 3 with the aid of the above function. The behavior of taking the wafer out of the wafer carrier 3 is illustrated in FIGS. 5 and 6.

After taking the wafer 60 from the wafer carrier 3, the pantagraph hand 15 moves upwardly by the driving mechanism 16, and rotates by the rotational driving mechanism 15, so that the wafer 60 is positioned above the pre-alignment station 7, as shown in FIG. 7. It is possible that the wafer carrier 3 is lowered at this time. Additionally, the pre-alignment station 7 may be located below the wafer carrier 3.

Referring to FIGS. 7, 8 and 9, the pre-alignment operation will be described. When the wafer 60 supported on the pantagraph hand finger 84 is placed above the pre-alignment station 7, the transportation hand 17 provided with the wafer sensor 83 starts to scan the wafer from the backside of the wafer, by moving below the pantagraph finger 84. During this scanning movement of the transportation hand 17, the wafer sensor 83 detects the outer periphery of the wafer on the pantagraph finger 84 in the direction of the Y-axis to obtain data regarding the outer periphery thereof. Subsequently, the pantagraph hand 15 collapses in the direction of X-axis, during which the outer periphery of the wafer is sensed in the direction of the X-axis. This is shown in FIG. 8.

By processing the data of the outer periphery of the wafer, the position of the wafer center is determined, and the pantagraph hand 15 is collapsed or expanded so that the above determined center of the wafer is brought into alignment with the center of the pre-alignment wafer rotating mechanism 85 in the direction of the X-axis shown in FIG. 7. Then, the pantagraph 15 lowers to allow the wafer to be placed on the wafer rotating mechanism 85. Prior to this operation, the transportation hand 17 is moved to the position shown in FIG. 9. After the wafer is transferred onto the wafer rotating mechanism 85, the pantagraph hand 15 takes the collapsed position as shown in FIG. 9, and completes the wafer transporting operation to the pre-alignment station 7.

The foregoing description of the operations has been made with respect to a full automatic loading operation, which is the main mode of the wafer prober according to this embodiment. However, in this apparatus, the manual loading and unloading operation is possible without difficulty and at a high speed. In the manual mode, the flat keyboard 30 located adjacent front right side shown in FIG. 3 is opened upwardly, and then the wafer to be probed is placed on the wafer rotating mechanism 85 of the pre-alignment station 7 which is located right below the flat keyboard 30. At this time, the transportation hand 17 is positioned at the pre-alignment station, more particularly, at the position indicated in FIG. 9, After the wafer is manually or automatically placed on the wafer rotating mechanism 85, the mechanism 85 vacuum-attracts the wafer and starts to rotate it. When the wafer thereon is not a cracked one or a deformed one, the wafer is positively attracted to the rotating mechanism 85, and is rotated thereby. During this rotation, the wafer sensor 83 of the transportation hand 17 traces the outer periphery of the wafer with the aid of the linear pulse motor 80, so that the orientational flat is detected. Then, the wafer rotating mechanism 85 positions the orientational flat in a predetermined direction.

If the center of the wafer placed on the rotating mechanism 85 from the pantagraph hand 15 is offset from the center of the wafer rotating mechanism 85 by a relatively large amount in the direction of the Y-axis shown in FIG. 7, the wafer on the wafer rotating mechanism 85 is lifted again by the transportation hand 17, and is moved in the Y direction to remove the offset, and then placed back onto the wafer rotating mechanism 85, thus removing this error. By this operation, the center of the wafer is aligned with the center of the wafer rotating mechanism 85, so that the desirable rotation of the wafer is made possible, in addition, the detection of the orientational flat by the wafer sensor 83 described above is more accurate and speedy.

In this embodiment, the wafer sensor 83 is a photosensor of reflection type, but may be a photosensor of a transmission type or an electrostatic capacity type or of what ever is suitable.

After the completion of the orientational flat detection on the wafer rotating mechanism 85, the wafer is rotated so that its orientational flat orients in the predetermined direction, and then, the wafer is lifted up from the pre-alignment station 7 by the transportation hand 17, and then is transported onto the wafer chuck 10 which is waiting for the wafer to come.

The wafer chuck 10 is provided with three wafer chuck pins 86 which can project therethrough beyond its surface. When the wafer chuck 10 receives the wafer from the transportation hand 17, the wafer chuck pins 86 take the projected position. With this state, the transportation hand 17 lowers by the driving mechanism 82, the wafer on the transportation hand 17 is placed on the wafer chuck pins 86 projecting through the surface of the wafer chuck 10. Subsequently, the transportation hand 17 moves back to the pre-alignment station 7. Then, the wafer chuck pin 86 moves down, so that the surface of the wafer chuck 10 receives the wafer and vacuum-attracts it.

In this embodiment, the wafer chuck pins 86 are projected beyond the surface of the wafer chuck 10 when the wafer is received. However, it is possible that the wafer chuck pins 86 are fixed, and the wafer chuck 10 is lowered without losing the necessary functions.

Referring back to FIG. 2, the operation after the wafer is received by the wafer chuck 10 of the X-Y stages 19 and 20 will be described. When the wafer chuck 10 receives the wafer, a scanning operation is effected with the aid of an electrostatic capacity type sensor 21 to detect the outer periphery of the wafer so as to effect more accurate alignment of the orientational flat and more accurate determination of the center of the wafer.

At this station, the alignment of the orientational flat is performed by rotating in the $\theta$ direction by the $\theta$-Z stage 18. After the more accurate pre-alignment, the wafer chuck 10 scans the sensor again with the aid of the electrostatic capacity type sensor 21 so as to detect the height of the surface of the wafer. The detection of the height is performed in order to obtain correction data to maintain constant pressure of contact between the probe needles of the probe card and the contacts of the wafer.

Thereafter, the wafer chuck 10 moves to place a predetermined position of the wafer is disposed right below the objective lens of the automatic alignment microscope 22. At this position, the pattern of the wafer observed through the automatic alignment microscope 22 when the wafer is actually placed, is compared with the template which has been memorized beforehand. By this, the detection is made as to the deviations of the wafer pattern on the chuck in X and Y directions from the predetermined position.

This detection is performed automatically in this embodiment by a positional deviation detecting device (unshown) using a pattern matching technique, disposed in a lower portion of the apparatus. This operation is carried out with respect to another predetermined point in order to determine a rotational ($\theta$) error.

From the detected errors in the X direction and the Y direction at each of the two points, the errors in the X direction, Y direction and $\theta$ direction, of the pattern of the wafer, is calculated. The $\theta$-component error is removed by rotating the wafer chuck 10, while the X direction error and the Y direction error are removed by moving the X-Y stage upon the probing operation.

After completion of removing the $\theta$-direction error and the detection of X and Y errors under the automatic alignment microscope 22, the first IC chip on the wafer is moved to below the probe card (not shown) fixed on the head plate 12. This operation is effected by the X and Y stages 19 and 20, during which the X and Y component errors are simultaneously removed. When the first chip is disposed below the probe card, the wafer chuck moves upwardly through a predetermined stroke by the Z-drive mechanism of the $\theta$-Z stage 18. By this upward movement of the wafer chuck 10, the bonding pads of the first chip of the wafer are brought into contact with the probe needles of the probe card in alignment with each other. Then, the wafer prober transmits a probe starting signal to an external tester (not shown), in response to which the tester starts to test the first chip. If the result of the test is positive, that is, the IC chip is good enough, the tester transmits a test end signal to the wafer prober. On the contrary, if the result is negative, the tester transmits the test end signal with a reject signal. The wafer prober, upon receiving the test end signal, discriminates the result of the test depending on whether the reject signal is received or not. When the reject signal is received, an inker (not shown) is actuated to mark the first chip.

When the series of operations for inspecting the first chip is completed in the above described manner, the X-Y stages 19 and 20 are moved to place the next IC chip below the probe card, and then the chip is inspected in the same manner as with the first chip. By repeating those operations, all the chips on the wafer are inspected.

Upon completion of the test for all of the IC chips on the wafer, the wafer chuck 10 is returned to its initial position shown in FIG. 2. The vacuum attraction is stopped, and the three wafer chuck pins 86 are projected through the wafer chuck 10 surface so as to raise the wafer from the wafer chuck 10. With this state, the pantagraph hand 15 taking the collapsed position is directed to the wafer chuck 10 as shown in FIG. 2, and subsequently the pantagraph hand 15 is expanded so as to insert the pantagraph hand finger 84 into the space between the wafer chuck 10 and the wafer. Then, the pantagraph hand 15 is raised slightly, and then, is collapsed to take the wafer back from the wafer chuck 10.

If the observing mode is selected, the pantagraph hand 15 delivers the wafer to the observation station 4. After a predetermined period of time elapses, or upon manual generation of wafer accommodating signal, the wafer is taken from the observation station 4. On the other hand, if the observing mode is not selected, the wafer is directly returned to the position where the same wafer was accommodated prior to the probing operation.

While the wafer being supported on the wafer chuck 10 and the being subjecting to the probing operation, the next wafer is taken out of the wafer carrier 3 by the pantagraph hand 15 and is delivered to the pre-alignment station 7. Thereafter, at the pre-alignment station 7, the pre-alignment operation described hereinbefore is performed. A will be understood, when the wafer which has been inspected is delivered from the wafer chuck 10, the next wafer has been pre-aligned and is waiting for the next operation at the pre-alignment station 7, and therefore, the time is not wasted by the pre-alignment and other operations prior to the transportation of the wafer to the wafer chuck 10.

When the probing operation is completed for all of the wafers in the wafer carrier 3 by repeating the above described operations, the carrier setting switch (not shown) on the operation panel 6 blinks to notify the operator of the completion of the wafer test for the wafer carrier. When the operator depresses the carrier setting switch, the second wafer carrier table 2 goes out of the apparatus toward the operator, so that the operation of taking the wafer carrier out or exchange the same is easy. If however, at the time when the carrier is to be exchanged, the second wafer carrier 2 carries a wafer carrier containing the wafers to be probed, the wafer prober in this embodiment continues the operation to probe those wafers automatically after the completion of the wafer probing operation for the first carrier.

Figure 10:
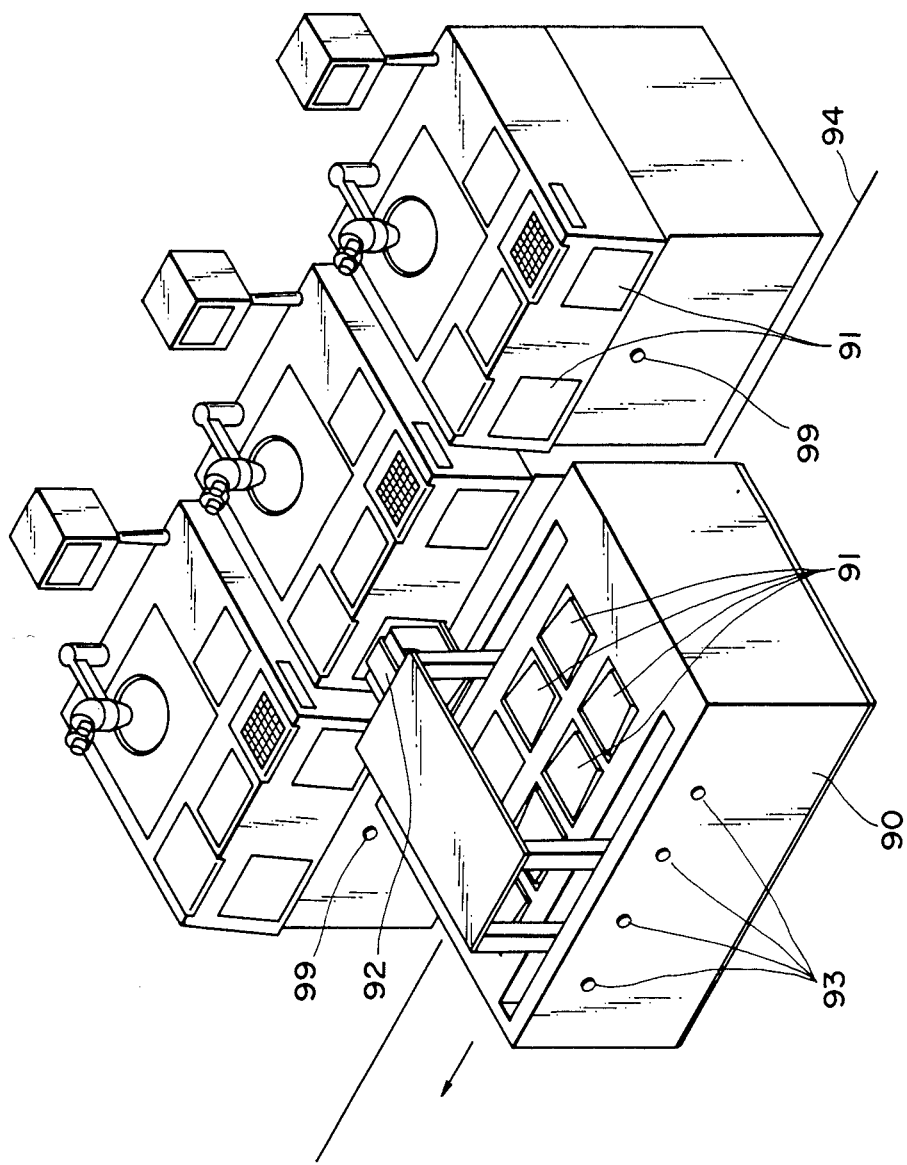
FIG. 10 is a perspective view of a wafer prober line using plural wafer probers of FIG. 1.
Figure 13:
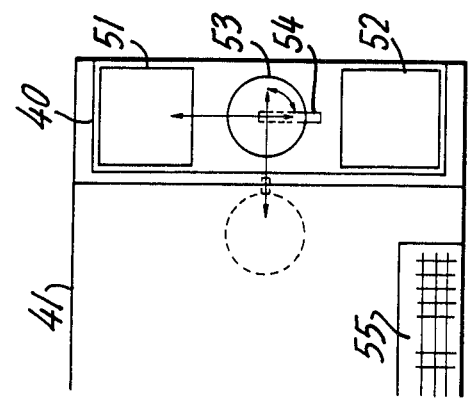
FIG. 13 is a plan view of a transportation system of a wafer prober proposed in an earlier application assigned to the assignee of the present application.
Figure 12:
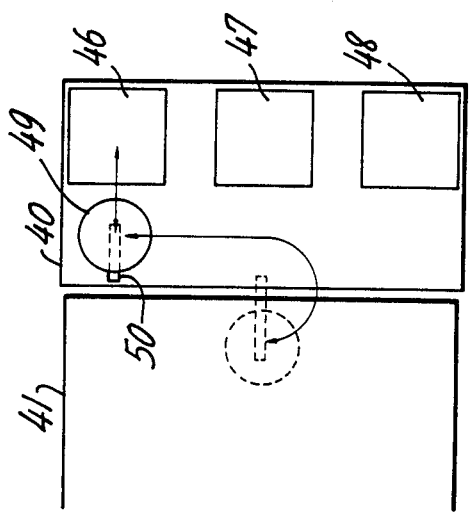
FIG. 12 is a plan view of a transportation unit of another conventional wafer prober.
Figure 11:
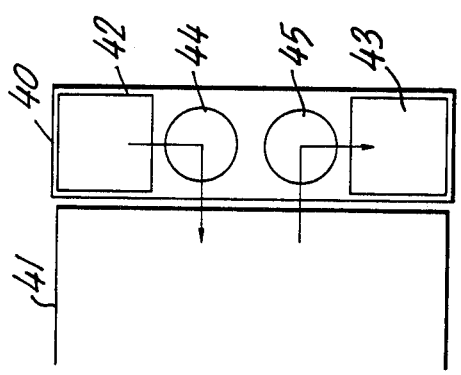
FIG. 11 is a plan view of a part of a wafer transportation system in a conventional wafer prober.
Figure 14:
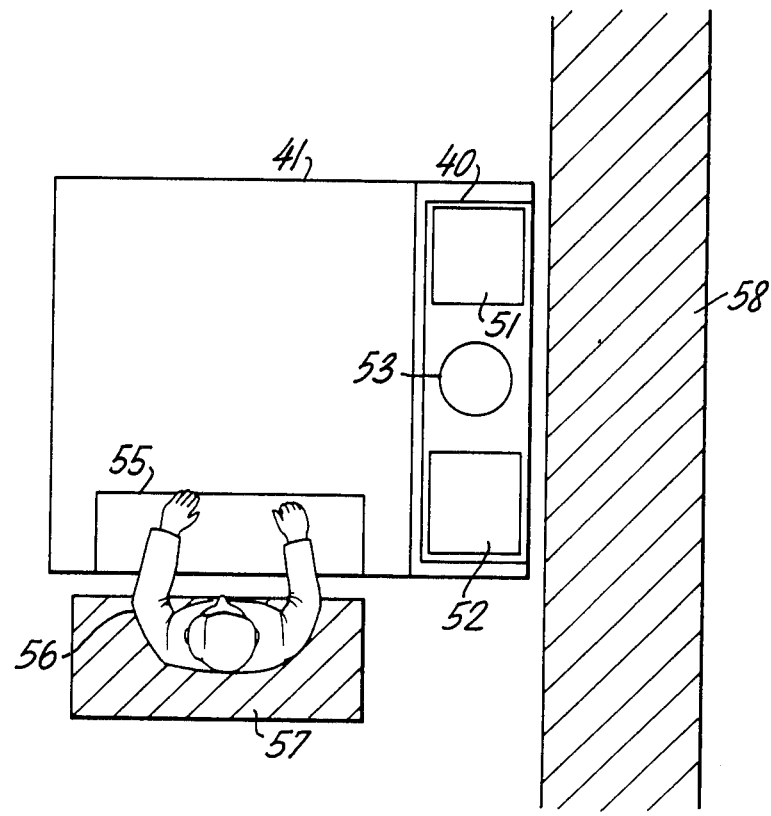
FIG. 14 is a top plan view illustrating the situation around the wafer prober using the transportation system of FIG. 13.
Figure 16:
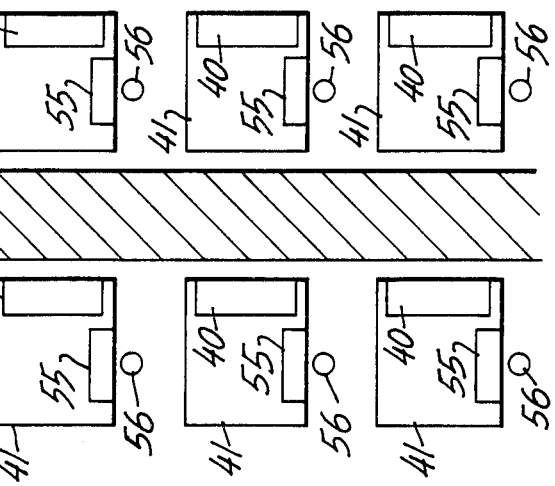
FIGS. 15 and 16 illustrate the arrangements of the wafer probers of FIG. 13.
Figure 15:
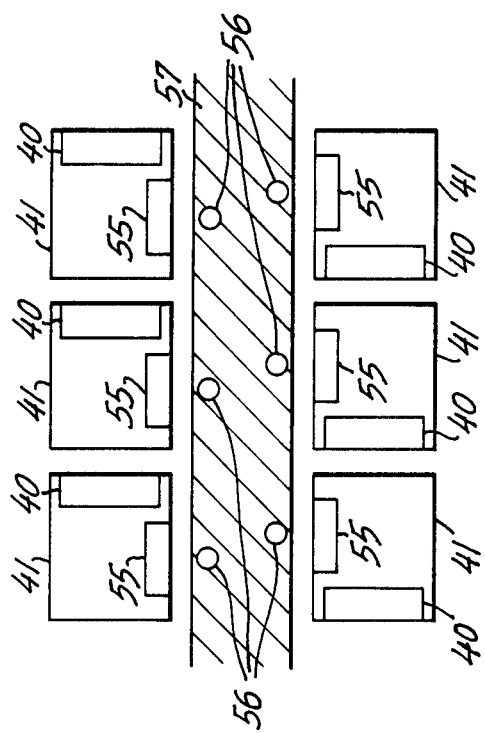

FIG. 10 illustrates an automatic wafer prober line using the present invention. A wafer cassette car 90 is movable along the front sides of the line of the probers. The wafer cassette car contains plural wafer carriers 91 and is provided with a wafer carrier transporting hand 92. The wafer cassette car 90 is also provided with ports for optical communication. Correspondingly, each of the wafer probers is provided with a light communication port.

In this arrangement, the wafer cassette car 90 normally reciprocate along the passage 94 extending beside the front sides of the wafer probers. Since the optical communication ports 93 and 99 are substantially at the same level, the communication is made between the wafer cassette car 90 and the wafer prober through those ports during the reciprocal movement. When the communication represents that the wafers in a wafer carrier have been probed, the wafer cassette car 90 stops in front of the wafer prober containing the same wafer carrier. Then, the wafer cassette car 90 moves at a low speed so that the amount of light received through the optical communication port 93 is maximum, whereby the wafer cassette car 90 is correctly positioned with respect to the wafer prober. Then, the wafer cassette car 90 transmits a signal to the wafer prober to notify the wafer prober of the exchange of the wafer carrier. Upon receiving the signal, the wafer prober pushes the wafer carrier table 2 carrying the wafer carrier containing the probed wafers toward the wafer cassette car 90, and then transmits a signal to the wafer cassette car 90 through the optical communication port 99 to notify it of the wafer carrier table 2 being projected. In response to the signal, the wafer cassette car 90 lifts the wafer carrier on the wafer carrier table 2 by the wafer carrier transportation hand 92, and places it at a predetermined position in the wafer cassette car. Subsequently, the wafer cassette car 90 takes out one of the wafer carriers 91 containing the unprobed wafers by the transportation hand 92, and then places it on the wafer carrier 2. Thereafter, it transmits a signal representing the termination of the exchange of the wafer carrier. When the wafer prober receives this signal, it put the wafer carrier table 2 into the prober. Thus, the exchange of the wafer carrier 91 is completed.

In the arrangement shown in FIG. 10, the line of the wafer probers is disposed only at one side of the passage 94 of the wafer cassette car 90. However, it is possible that another line of the wafer probers is disposed along the other side of the passage, with their front sides facing the passage 94. As described in the foregoing, according to the embodiments of the present invention, the following advantages are provided.

Firstly, since the wafer carrier and the wafer hand capable of taking the wafers out of the wafer carrier and putting the wafers back into the wafer carrier are disposed adjacent the front side of the wafer prober, the operator can stand facing the front side of the wafer prober when the wafer carrier is to be exchanged, thus enhancing the operability. Additionally, no wasteful space is required for the carrier exchange at a lateral side of the apparatus, whereby the space in the factory is used efficiently.

Secondary, since the wafer carrier can be exchanged from the front side of the apparatus, it is particularly advantageous when a large size wafer carrier is to be exchanged. Additionally, it is easily accommodated to automatic line of the wafer probers in a factory as shown in FIG. 10.

Thirdly, the pre-alignment station is located below the keyboard, and the wafer carrier accommodating portion is located below the pre-alignment station, and therefore, the size of the apparatus is reduced. In more general way, at least a part of the wafer supported on the pantagraph hand enters the space defined by the upward or downward extensions of the vertical walls of the wafer carrier, so that the space can be more efficiently utilized. In addition, the pre-alignment station and the observing station are located adjacent the upper front side, and therefore, the manual wafer loading and unloading are very easy. Furthermore, during the observing operation, the entire surface of the wafer is easily observed by naked eyes after termination of the inspection.

As a fourth advantage, the outer periphery of the wafer is sensed by a non-contact type sensor with the aid of the cooperation of two wafer transporting hands which are movable in the orthogonal directions, by which the determination of the center of the wafer and the correct orienting of the orientational flat can be executed irrespective of the size of the wafer.

Figure 17:
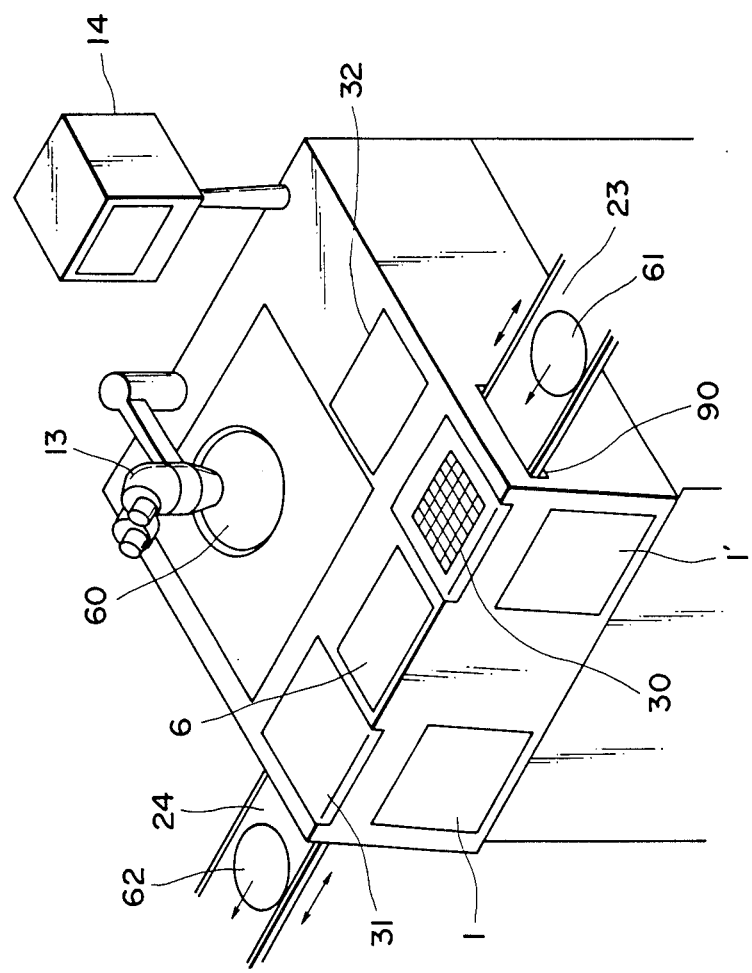
FIGS. 17 and 18 are perspective views of an example of arrangement of the wafer probers.
Figure 18:
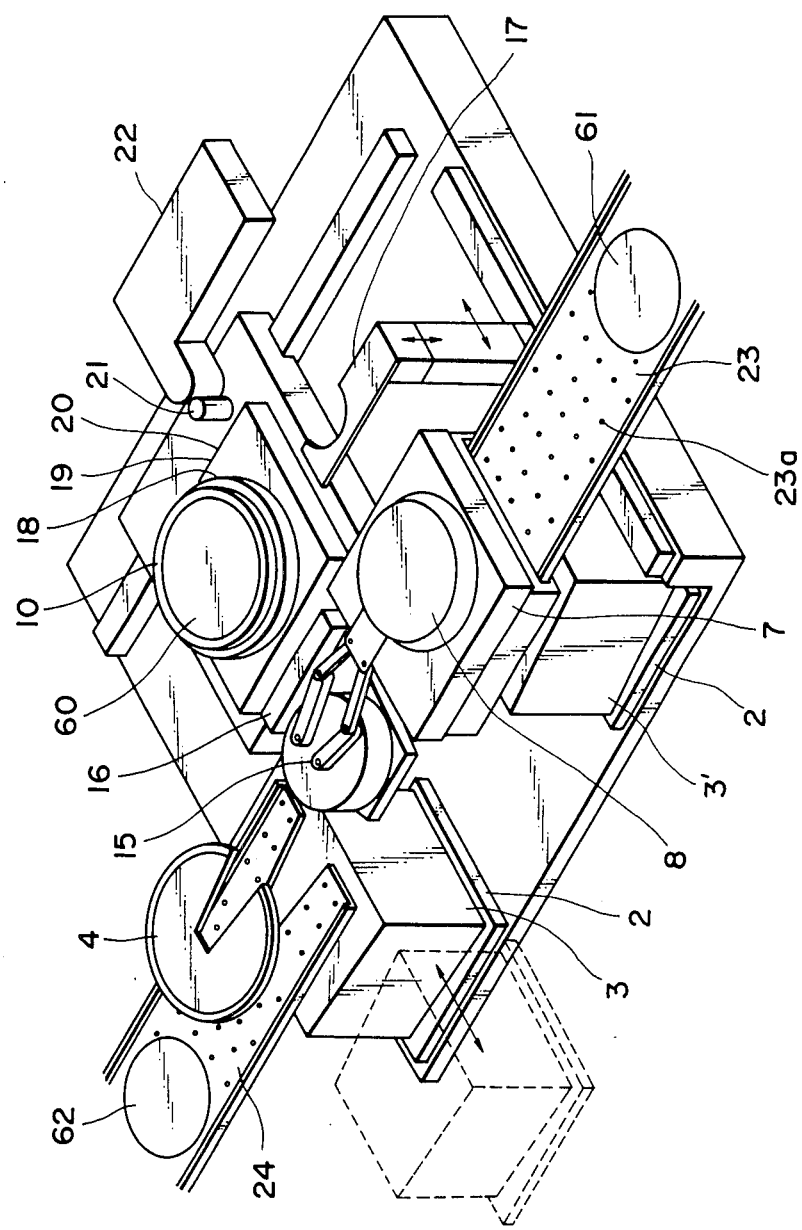

FIGS. 17 and 18 illustrate another embodiment of the present invention which is suitable to an in-line arrangement of the wafer prober. A feeding track 23 for feeding the wafers into the prober is inserted into the prober at an upper portion of the lateral side of the prober adjacent the front side thereof, as shown in FIGS. 17 and 18. A discharging track 24 for discharging the wafers to the outside of the prober is inserted at the opposite side, as shown in FIGS. 17 and 18. The ports 90 through which the tracks are inserted into the wafer prober are located below the associated stations 7 and 4, respectively. The wafer to be transported into the prober and the wafer to be discharged therefrom are designated by the reference numerals 61 and 62 respectively.

In operation, the wafer 61 is moved into the wafer prober by the air flow through perforations 23a in the upper surface of the feeding track 23. The wafer 61 thus fed once stops below the pre-alignment station 7 shown in FIG. 18. When the fact that the wafer 61 comes to this position is detected, the pantagraph hand 15 takes and transports this wafer to the up-stage pre-alignment station 7, where the pre-alignment operation described hereinbefore starts. If, however, the previous wafer still remains on the pre-alignment station 7, or if a wafer or wafers waiting for the probing operation are still remaining in an input buffer carrier 3', then the wafer 61 on the feeding track 23 is accommodated into a vacant portion of the input buffer carrier 3' by the pantagraph hand 15. The buffer carrier 3' is of the same construction as the carrier 3 described hereinbefore with FIG. 2. Therefore, the carrier 3 or 3' is commonly usable to the off-line arrangement and to the in-line arrangement. The same thing applies to an output buffer carrier.

The subsequent operations are the same as described hereinbefore with respect to the off-line arrangement.

After completion of those operations, the wafer is accommodated into the output buffer carrier 3. Any wafer in the output buffer carrier 3 is brought therefrom onto the discharging track 24 by the pantagraph hand 15, whereby it is transported out of the apparatus.

As will be understood, in this embodiment, the portion of the apparatus where the wafer carrier or buffer carrier is loaded or unloaded and the portion where the wafer is supplied into the apparatus or the wafer is discharged out of the apparatus, are formed in substantially vertically extending walls of the apparatus. The direction of the loading and unloading of the wafer carrier and the direction of receiving or discharging the wafer, are substantially orthogonal. The loading and unloading portion and the control key input portion are disposed adjacent to each other.

According to this embodiment of the present invention, the following advantages result.

Firstly, the input buffer carrier, the output buffer carrier and the wafer handling hand for transporting the wafer are disposed adjacent the front side of the wafer handling apparatus, and the wafer receiving position and the wafer discharging position are located above those buffer carriers, and further thereabove, the prealignment station and the observing station are disposed, respectively. Therefore, the space can be utilized efficiently in the vertical direction, whereby the size of the apparatus can be reduced very much.

Secondary, the wafer receiving and discharging line extends from the right to the left or from the left to the right as seen by the operator standing facing the front side of the apparatus when the operations are in order. Therefore, the latitude of the arrangement is larger with respect to the in-line arrangement in a factory.

Thirdly, the apparatus is provided with all the functions necessary for the off-line operation, and therefore, the operation mode can be changed to the off-line mode without delay.

Fourthly, the apparatus can be used conveniently as exposure, development, resist formation apparatus and others, without limitation to the prober.

It will be understood that the off-line embodiment of the present invention is also applicable to the exposure, development, resist formation or the like apparatus.

While the invention has been described with reference to the structures disclosed herein, it is not confined to the details set forth and this application is intended to cover such modifications or changes as may come within the purposes of the improvements or the scope of the following claims.

What is claimed is:

1. A wafer processing apparatus, comprising:
a wafer processing station for processing a wafer and having a wafer chuck;
an x-y stage for moving the wafer chuck in x and y directions which are orthogonal;
a wafer carrier station for supporting a wafer carrier accommodating a plurality of wafers;
a wafer prealignment station, disposed substantially in alignment with said wafer carrier station in a z direction which is perpendicular to the x and y directions, for preliminarily aligning the wafer on the basis of an outer periphery thereof;
a first hand mechanism for conveying the wafer from the wafer carrier supported by said wafer carrier station to said wafer prealignment station; and
a second hand mechanism for conveying the wafer preliminarily aligned by said prealignment station to the wafer chuck.

2. An apparatus according to claim 1, wherein said first hand mechanism moves the wafer in the z direction and in one of x and y directions, said second hand mechanism moves the wafer in the z direction and in one of x and y directions.

3. An apparatus according to claim 1, wherein said first hand mechanism conveys the wafer from the wafer chuck to the wafer carrier.

4. An apparatus according to claim 1, wherein said prealignment station includes a mechanism for rotating the wafer, and said second hand mechanism is provided with a sensor for sensing the outer periphery of the wafer while the wafer is being rotated by the rotating mechanism.

5. A wafer processing apparatus, comprising:
a wafer processing station for processing a wafer, having a wafer chuck;
an x-y stage for moving the wafer chuck in x and y directions which are orthogonal;
first and second wafer carrier stations, arranged on a line substantially parallel with one of x and y directions, for supporting wafer carriers accomodating plural wafers, respectively;
a wafer prealignment station, disposed substantially in alignment with said first wafer carrier station in a z direction which is perpendicular to the x and y directions, for preliminary aligning the wafer on the basis of an outer periphery thereof;
a first hand mechanism for conveying the wafer from the wafer carrier supported by said wafer carrier station to said wafer prealignment station; and
a second hand mechanism for conveying the wafer preliminary aligned by said wafer prealignment station to the wafer chuck.

6. An apparatus according to claim 5, wherein said first and second carriers stations have wafer carrier supporting tables movable in the other of x and y directions.

7. An apparatus according to claim 5, further comprising a body cover for enclosing a main part of said apparatus, wherein said body cover is provided with an operation panel on a side thereof where said first and second wafer carrier stations are disposed.

8. An apparatus according to claim 5, further comprising a body cover for enclosing a main part of said apparatus, wherein said body cover is provided, at a side thereof where said first and second wafer carrier stations are disposed, with an optional communication window for providing externally information of exchange of the wafer carrier supported by at least one of said first and second wafer carrier stations.

9. A wafer processing apparatus, comprising:
a wafer processing station for processing a wafer, having a wafer chuck;
an x-y stage for moving the wafer chuck in x and y directions which are orthogonal;
first and second wafer carrier stations, arranged on a line substantially parallel with one of said x and y directions, for supporting wafer carriers accommodating plural wafers, respectively;
first and second wafer stations disposed substantially in alignment with said wafer carrier stations, respectively in a z direction which is perpendicular to the x and y directions, said first wafer station preliminarily aligning the wafer on the basis of an outer periphery thereof;

a first hand mechanism, disposed between said first and second wafer carrier stations, for conveying the wafer from the wafer carrier supported by at least one of said first and second carrier stations to said first wafer station, and for conveying the wafer from the wafer chuck to at least one of said second wafer station and the wafer carriers; and a second hand mechanism for conveying the wafer preliminarily aligned by said first wafer station to the wafer chuck.

* * * * *